United States Patent
Venrooij et al.

(10) Patent No.: US 6,848,174 B2
(45) Date of Patent: Feb. 1, 2005

(54) APPARATUS AND METHOD FOR PROCESSING ELECTRONIC COMPONENTS

(75) Inventors: Johannes Lambertus Gerardus Maria Venrooij, Duiven (NL); Adrianus Henricus Ignatius Maria Verkuijlen, Didam (NL)

(73) Assignee: Fico B.V. (NL)

(*) Notice: Subject to any disclaimer, the term of this patent is extended or adjusted under 35 U.S.C. 154(b) by 200 days.

(21) Appl. No.: 10/204,518

(22) PCT Filed: Feb. 21, 2001

(86) PCT No.: PCT/NL01/00148

§ 371 (c)(1),
(2), (4) Date: Dec. 6, 2002

(87) PCT Pub. No.: WO01/63649

PCT Pub. Date: Aug. 30, 2001

(65) Prior Publication Data

US 2003/0140492 A1 Jul. 31, 2003

(30) Foreign Application Priority Data

Feb. 23, 2000 (NL) .............................................. 1014472

(51) Int. Cl.⁷ .............................. H05K 3/30; B23P 23/00
(52) U.S. Cl. ....................... 29/841; 29/564.1; 29/564.2; 29/566; 29/700; 29/832
(58) Field of Search .............................. 29/564.1, 564.2, 29/566, 700, 592.1, 832, 841

(56) References Cited

U.S. PATENT DOCUMENTS

| 4,801,168 A | 1/1989 | Sato |
| 5,364,225 A | 11/1994 | Hecht et al. |
| 5,810,935 A | 9/1998 | Lee et al. |
| 5,923,966 A | 7/1999 | Teramoto et al. |

FOREIGN PATENT DOCUMENTS

| WO | WO 94/05459 | 3/1994 |
| WO | WO 99/02436 | 1/1999 |

*Primary Examiner*—Carl J. Arbes
(74) *Attorney, Agent, or Firm*—Webb Ziesenheim Logsdon Orkin & Hanson, P.C.

(57) ABSTRACT

The invention relates to an apparatus for processing electronic components, such as semi-conductor products, comprising at least two processing stations, at least one supply/discharge position for electronic components, a robot arm with engaging means for engaging the electronic components for displacing electronic components between the supply/discharge position and the processing stations, and a control for actuating the robot arm and the processing stations. The invention also relates to an assembly of at least two such apparatuses and to a method for processing electronic components which can be performed by means of the apparatus according to the invention.

19 Claims, 2 Drawing Sheets

APPARATUS AND METHOD FOR PROCESSING ELECTRONIC COMPONENTS

BACKGROUND OF THE INVENTION

1. Field of the Invention

The invention relates to an apparatus for processing electronic components, such as semi-conductor products. The invention also relates to an assembly of at least two of such apparatuses and a method for processing electronic components wherein the apparatus and the assembly can be used.

2. Description of the Prior Art

The processing of electronic components such as semi-conductor products, and in particular the encapsulation of such components, generally takes place using complex and accurate equipment which is consequently also expensive. It is of great importance for breakdowns and unproductive standstill to be prevented, while far-reaching automation of the processing is moreover desirable. Heretofore a plurality of processing stations have been rigidly coupled to each other for this purpose, wherein the electronic components for processing are carried with a more or less fixed routing along the processing stations. A drawback of this prior art is that the freedom of choice in respect of the routes to be followed is very limited. It is moreover difficult to harmonize the processing capacity of the different processing stations with each other.

The American U.S. Pat. No. 5,364,225 describes a method for producing printed circuit boards which takes place in a clean room. To this end the printed circuit boards for processing are carried in housings specially developed for this purpose, along which housings the printed circuit boards are displaced in transport containers. Use is made of robot arms to displace printed circuit boards between the transport containers and a processing station disposed in a separate housing.

The present invention has for its object to provide an apparatus and method with which electronic components can be encapsulated in more flexible manner and with which the capacity of the available processing stations is better utilized than according to the prior art. Another object is to provide an apparatus which can be integrated in simple manner into a larger whole of apparatuses.

SUMMARY OF THE INVENTION

The invention provides for this purpose an apparatus for processing electronic components of the type stated in the preamble, characterized in that the processing stations comprise at least one encapsulating station for enclosing electronic components with encapsulating material in a mould, the apparatus comprises at least one supply position for encapsulating material and the robot arm with engaging means is also adapted to displace encapsulating material from the supply position to the encapsulating station. A first advantage of such an apparatus is that it can be coupled in very simple manner to a universal transport system which likewise forms part of the product assortment of the present applicant. Such a transport system causes only feed and outfeed of electronic components to the supply/discharge position. Further displacement and processing of the electronic components takes place by the apparatus according to the invention such that the required interaction between the apparatus according to the invention and the transport system can remain very limited, coupling of the control systems is unnecessary. A second very important advantage is the great freedom of choice in the routing of the electronic components within the apparatus. Diverse processing sequences and processes performed in parallel can be realized without any problem using the apparatus according to the invention. This great flexibility has the added advantage that the mix of electronic components for processing can be chosen such that the capacity of the processing stations is utilized as well as possible. Another advantage is that the processing stations of the apparatus can be modified as required without the transport means having to be adjusted for this purpose. Only the control of the robot arm may possibly have to be adapted. It is likewise possible that one or more processing stations are not deployed during operation of the apparatus because of for instance overhaul, change-over and so on. One advantage of the apparatus according to the invention which has not yet been stated but which is very important is that the transport of the electronic components, which does not provide any added value, does not limit the capacity of the processing stations, at least when the capacity of the processing stations is dimensioned correctly relative to the capacity of the robot arm. It has been found possible in practice to serve as many as six processing stations with a single robot arm without the transport leading to capacity loss at the processing stations. One or more of the following processing stations can thus form part of the apparatus: supply, detection, pre-heating, pellet load, degating discharge station and so on. In addition to the manipulation of electronic components for processing, other objects such as additive material can also be displaced with the engaging means. Particularly during encapsulation, electronic components such as semi-conductor products require a number of handling operations which can be carried out relatively advantageously by means of the apparatus according to the invention. It is logical herein to also carry out associated processes, such as for instance the pre-heating and supplying of additive materials such as for instance pellets, films or other materials, with the same apparatus.

Another significant advantage of the present invention is that the relatively complex encapsulating process can be carried out in automated manner with very simple means, particularly if according to a preferred embodiment the robot arm with engaging means is adapted to pick up encapsulating material parts at controlled mutual distances. Also required for the encapsulation in addition to the components for encapsulating are pellets of encapsulating material which must be placed in the encapsulating device in a relative orientation defined by the geometry of the encapsulating device. In the automation of the encapsulating process use has always been made heretofore of a separate indexing mechanism to place a number of pellets of encapsulating material in the required orientation. The positioned pellets are then carried from this mechanism into the encapsulating device, optionally via intermediate transporting means. The present invention makes the prior art indexing mechanism unnecessary; when the pellets are provided at one or several positions, the robot arm with engaging means can be moved in indexed manner along this delivery point/these delivery points to immediately engage the pellets with the engaging means in the orientation required during encapsulation.

In a preferred embodiment the processing stations, the supply/discharge position and the robot arm are combined with a common frame. The mutual positions of processing stations and the supply/discharge position can thus be fixed. The frame can also be provided in very simple manner with one or more lay-off positions. In addition, the separate processing stations can be given a relatively light form.

For an even more universal application of the apparatus, it can also be provided with a replacing station for automatically replacing the engaging means coupled to the robot arm. It is also possible for other product-related replacement parts, for instance of the processing stations, to be automatically replaced by the robot arm. The replacement parts must of course be accessible to the robot arm for this purpose.

In yet another preferred variant the control is adapted to displace the robot arm along a processing station in indexed manner. It is hereby possible to replace multiple processing stations by simpler, for instance single, processing stations. It is thus possible for instance to inspect a complex pattern of holes in a lead frame in a processing station which is only provided with a single inspection sensor by carrying this lead frame in indexed manner past the single inspection sensor.

For further automation of the control, depending on the products to be processed the robot arm can be provided with a sensor for detecting component data. For this purpose use can for instance be made of a bar-code reader. It is also possible to provide a product carrier with which the electronic components can be placed at the supply position with an identifying code which can be read by the apparatus.

In yet another variant of the apparatus the engaging means of the robot arm are provided with a plurality of grippers placed at a mutual distance. These grippers can be placed apart with standardized interspacing. In particular, single strips of electronic components provided on one side with gates can thus be engaged irrespective of format, at least when standard intermediate distances are set for this purpose which are taken into account in the product design.

As already described above, the supply/discharge position can be adapted to receive a product carrier for electronic components. The electronic components can then be removed from the product carrier by the robot arm for processing, but it is also conceivable for the product carrier with electronic components to be supplied to a processing station by the robot arm.

The apparatus is further preferably given a modular structure such that processing stations can be added respectively removed as desired. When production volumes increase a number of processing stations can thus for instance be added.

At least two of the apparatuses as described above can be combined wherein the robot arms of the apparatuses have at least partially overlapping areas of operation. It is also possible herein that at least one processing station can be served by two robot arms. Such an assembly of apparatuses requires little space and is very flexibly in use.

The invention also provides a method for processing electronic components, such as semi-conductor products, by engaging electronic components at a supply position by means of a robot arm, passing with the robot arm along at least two processing stations for processing of the electronic components and subsequently displacing the processed electronic components to a discharge position. In a preferred embodiment of the method different electronic components are carried along processing stations by the robot arm with varying routing. The advantages of this method have already been described with reference to the apparatus according to the invention. The most important advantages are higher degree of utilization of the processing stations, flexibility in mix of the electronic components for processing and simplification of the processing stations.

In a particular preferred application of the method the electronic components, respectively product carriers for the electronic components, are provided with an identification on the basis of which the routing of the associated components along the processing stations is determined. With this method an automatic control of a robot arm and at least two processing stations can be realized which is actuated by the products for processing. Such a control is possible without central production planning, so that linked automation of a whole production line becomes unnecessary: local units are controlled on the basis of the information sent with the electronic components.

In yet another preferred application of the method according to the present invention the robot arm with engaging means is carried in controlled manner along at least one delivery point for encapsulating material in order to pick up encapsulating material parts at controlled mutual distances with the engaging means. The encapsulating material parts picked up with the engaging means can herein be placed in an encapsulating device in a configuration suitable for processing. The advantages of this preferred application are already described above with reference to the apparatus according to the invention.

In yet another preferred application of the method the electronic components are carried along at least two encapsulating devices for encapsulation of the electronic components in a plurality of phases. The encapsulation of electronic components in a plurality of phases is unknown up to the present but makes it possible to manufacture products which could not be made heretofore or makes it possible to manufacture products with greater accuracy than heretofore. Products which must be particularly envisaged here are semiconductors wherein a housing part must be moulded on two sides of a plate-like carrier. Both sides of the housing can now be manufactured with the apparatus and method according to the invention in two separate production runs without this having to result in a considerable increase in the complexity of the apparatus or the method. The manufacture of an encapsulation of an electronic component in at least two separate encapsulating operations also forms an independent part of the present application.

BRIEF DESCRIPTION OF THE DRAWINGS

The present invention will be further elucidated with reference to the non-limitative embodiments shown in the following figures. Herein.

DETAILED DESCRIPTION OF THE PREFERRED EMBODIMENTS

Figure 1A:
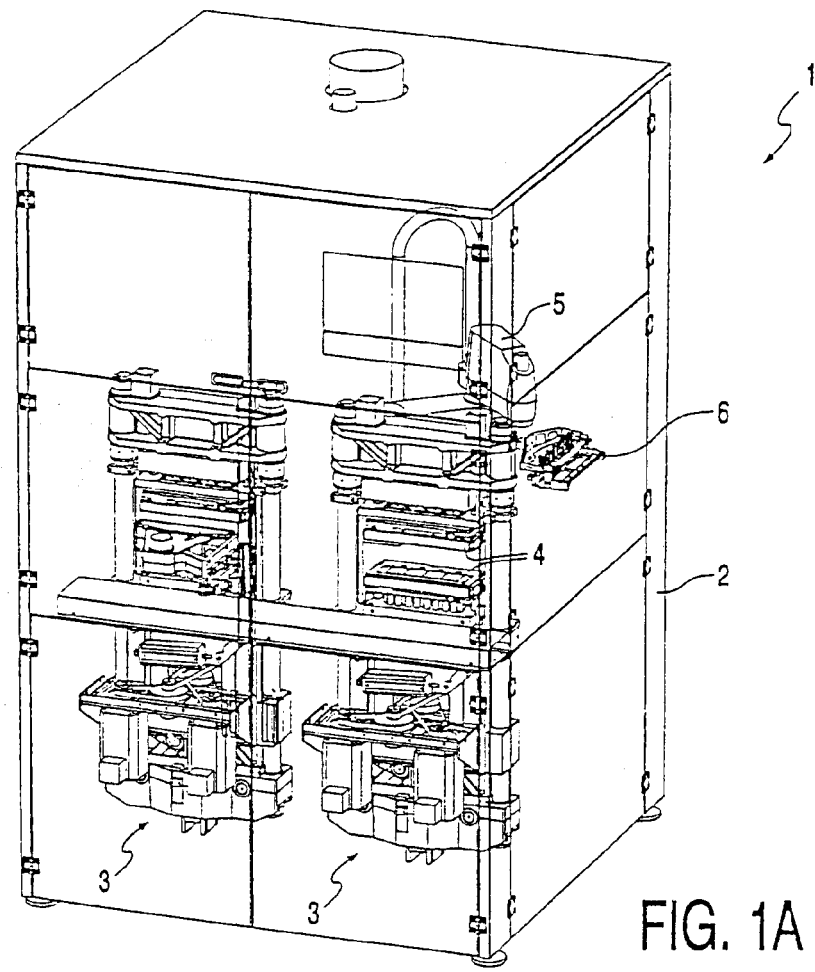
FIG. 1A shows a perspective view of a schematic representation of the embodiment according to the invention.

FIG. 1A shows an apparatus 1 with a frame 2 in which two presses 3 are mounted. Presses 3 each comprise two mould halves 4 which are movable relative to each other and between which electronic components can be clamped to then be encapsulated. Also assembled with frame 2 is a robot arm 5 which is provided on its free end with a gripper head 6. Presses 3 are disposed relative to robot arm 5 such that using gripper head 6 electronic components can be placed between mould halves 4 or can be removed from mould halves 4.

Figure 1B:
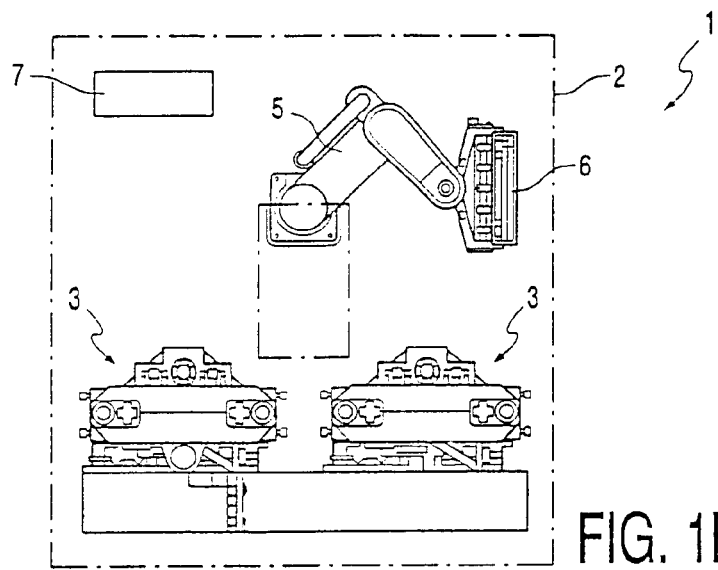
FIG. 1B shows a top view of the apparatus shown in FIG. 1A.

FIG. 1B shows apparatus 1 in top view which shows clearly that sufficient space is available inside frame 2 for supplying respectively discharging electronic components to and from apparatus 1. For this purpose a supply/discharge position 7 is defined inside frame 2 which lies within the reach of robot arm 5 such that electronic components can be picked up respectively laid off at position 7. In addition to presses 3, numerous other processing stations can also be combined with frame 2. It is also possible to accommodate a storage container inside frame 2 in which gripper heads 6 can be exchanged automatically such that products requiring a product-related ripper can also be processed with apparatus 1.

Figure 2:
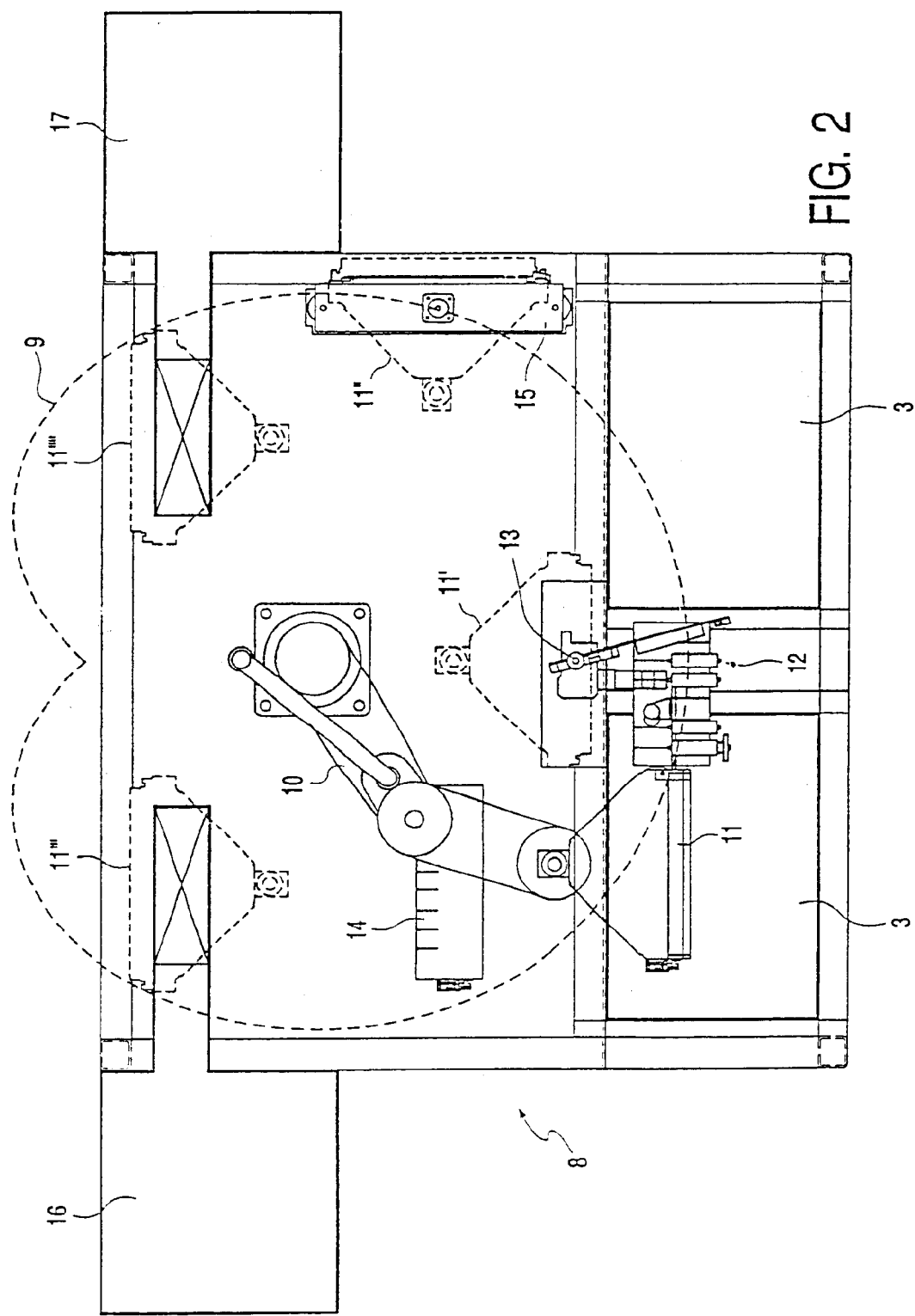
FIG. 2 shows a top view of an alternative embodiment of the apparatus according to the invention.

FIG. 2 shows a top view of an alternatively embodied apparatus 8 in which the operational range of a robot arm 10 with gripper head 11 is shown by means of a broken line 9. In the shown position the robot arm 10 with gripper head 11 is situated in one of the presses 3 which are only shown schematically in this figure. At a position midway between presses 3 is placed a pellet supply device 12 with a single loading position 13. For loading of gripper head 11 with a plurality of adjacently positioned pellets the gripper head 11 must be moved, as shown by means of gripper head 11' shown in broken lines, below loading position 13 in indexed manner with stop-start movements. Presses 3 can thus also be loaded with pellets by robot arm 10.

Other processing stations which can be served by robot arm 10 are a pre-heating station 14, in which the electronic components to be processed by presses 13 can be brought to a desired temperature level, and a so-called "degater" 14 in which the encapsulated electronic components can be released from the associated gates. The situation of gripper head 11 when it operates degater 15 is illustrated by means of the gripper head 11" shown in broken lines.

For supply of electronic components for processing a supply station 16 is provided which is accessible for gripper head 11 as is illustrated by means of the ripper head 11'" shown in broken lines. Similarly to supply station 16, a discharge station 17 is also provided which is accessible for gripper head 11 as illustrated by means of gripper head 11"" shown with broken lines. It is noted that supply station 16 and discharge station 17 can also be combined at a single position and/or that the supply of electronic components takes place by means of a universal transport system also developed by the present applicant.

Although the invention is elucidated with reference to only several embodiments, it will be apparent to all that the invention is in no way limited to the described and shown embodiments. On the contrary, many more variations are possible for a skilled person within the scope of the invention.

What is claimed is:

1. An apparatus for processing electronic components, such as semi-conductor products, comprising:
   at least two processing stations,
   at least one supply/discharge position for electronic components,
   a robot arm with engaging means for engaging the electronic components and for displacing electronic components between the supply/discharge position and the processing stations, and
   a control for actuating the robot arm and the processing stations,
   wherein, the processing stations comprise at least one encapsulating station for enclosing electronic components with encapsulating material in a mould, and the apparatus further comprises at least one supply position for encapsulating material, and the robot arm with engaging means is also adapted to displace encapsulating material from the supply position to the encapsulating station.

2. The apparatus as claimed in claim 1, wherein the robot arm with engaging means is adapted to pick up encapsulating material parts at controlled mutual distances.

3. The apparatus as claimed in claim 1, wherein the processing stations, the supply/discharge position for electronic components and the robot arm are combined with a common frame.

4. The apparatus as claimed in claim 1, wherein at least one of the processing stations is a supply, detection, pre-heating, pellet load, degating or discharge station.

5. The apparatus as claimed in claim 1, wherein the apparatus comprises a replacing station for automatically replacing the engaging means coupled to a robot arm.

6. The apparatus as claimed in claim 1, wherein the control is adapted to displace the robot arm along a processing station in indexed manner.

7. The apparatus as claimed in claim 1, wherein the robot arm is provided with a sensor for detecting component data.

8. The apparatus as claimed in claim 1, wherein the engaging means of the robot arm are provided with a plurality of grippers placed at a mutual distance.

9. The apparatus as claimed in claim 8, wherein the grippers are placed apart with standardized interspacing.

10. The apparatus as claimed in claim 1, a wherein the supply/discharge position for electronic components is adapted to receive a product carrier for electronic components.

11. The apparatus as claimed in claim 1, wherein the apparatus is given a modular structure such that processing stations can be added and respectively removed as desired.

12. An assembly of at least two apparatuses as claimed in claim 1, wherein the robot arms of the apparatuses have at least partially overlapping areas of operation.

13. The assembly as claimed in claim 10, wherein at least one processing station can be served by two robot arms.

14. A method for processing electronic components, such as semi-conductor products, by engaging electronic components at a supply position for electronic components by means of a robot arm, passing the robot arm along at least two processing stations for processing of the electronic components and subsequently displacing the processed electronic components a discharge position for electronic components.

15. The method as claimed in claim 14, wherein different electronic components are carried along processing stations by the robot arm with varying routing.

16. The method as claimed in claim 14, including product carriers for the electronic components, said product carriers provided with an identification on the basis of which the routing of the associated components along the processing stations is determined.

17. The method as claimed in claim 14, wherein the robot arm with engaging means is carried in controlled manner along at least one delivery point for encapsulating material in order to pick up encapsulating material parts at controlled mutual distances with the engaging means.

18. The method as claimed in claim 17, wherein the encapsulating material parts picked up with the engaging means are placed in an encapsulating device in a configuration suitable for processing.

19. The method as claimed in claim 14, wherein the electronic components are carried along at least two encapsulating devices for encapsulation of the electronic components in a plurality of phases.

* * * * *

UNITED STATES PATENT AND TRADEMARK OFFICE
CERTIFICATE OF CORRECTION

PATENT NO. : 6,848,174 B2
DATED : February 1, 2005
INVENTOR(S) : Venrooij et al.

It is certified that error appears in the above-identified patent and that said Letters Patent is hereby corrected as shown below:

Title page,
Item [56], References Cited, U.S. PATENT DOCUMENTS,
-- 5,083,370   01/1992   Koch et al.
   5,157,830   10/1992   Koch
   6,376,921   04/2002   Yoneda et al. --.

Column 6,
Line 26, "a wherein the" should read -- wherein the --.
Line 35, "as claimed in claim 10" should read -- as claimed in claim 12 --.
Line 43, "components a discharge portion" should read -- components to a discharge position --.

Signed and Sealed this

Sixteenth Day of August, 2005

JON W. DUDAS
*Director of the United States Patent and Trademark Office*